(12) United States Patent
Kim

(10) Patent No.: US 9,762,186 B2
(45) Date of Patent: Sep. 12, 2017

(54) REGULATED CASCODE (RGC)-TYPE BURST MODE OPTIC PRE-AMPLIFIER HAVING EXTENDED LINEAR INPUT RANGE

(71) Applicant: ELECTRONICS AND TELECOMMUNICATIONS RESEARCH INSTITUTE, Daejeon-si (KR)

(72) Inventor: Young Ho Kim, Sejong-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/887,869

(22) Filed: Oct. 20, 2015

(65) Prior Publication Data

US 2016/0142026 A1 May 19, 2016

(30) Foreign Application Priority Data

Nov. 14, 2014 (KR) .................. 10-2014-0159096

(51) Int. Cl.
*H03F 3/08* (2006.01)
*H04B 10/67* (2013.01)
(Continued)

(52) U.S. Cl.
CPC .......... *H03F 3/082* (2013.01); *H03F 1/0211* (2013.01); *H03F 1/223* (2013.01);
(Continued)

(58) Field of Classification Search
CPC ........ H03F 3/082; H03F 1/0211; H03F 1/223; H03F 3/45197; H03F 3/08; H03F 3/085;
(Continued)

(56) References Cited

U.S. PATENT DOCUMENTS

| 5,714,909 A * | 2/1998 | Jackson | ................ H03F 3/082 |
| | | | 330/308 |
| 6,114,913 A * | 9/2000 | Entrikin | .................. H03F 3/08 |
| | | | 330/308 |

(Continued)

FOREIGN PATENT DOCUMENTS

| JP | 4912340 B2 | 1/2012 |
| KR | 100381410 B1 | 4/2003 |

(Continued)

OTHER PUBLICATIONS

Xin Yin et al. "A 10Gb/s Burst-Mode TIA with On-Chip Reset/Lock CM Signaling Detection and Limiting Amplifier with a 75ns Settling Time", 2012 IEEE International Solid-State Circuits Conference Digest of Technical Papers (ISSCC) Feb. 19-23, 2012; pp. 416-418.

*Primary Examiner* — Khanh V Nguyen
(74) *Attorney, Agent, or Firm* — Ladas & Parry LLP; Loren K. Thompson

(57) ABSTRACT

A Regulated Cascode (RGC)-type burst mode optic preamplifier having an extended linear input range. The burst mode optic pre-amplifier comprises an RGC-type Trans Impedance Amplifier (TIA), wherein a current path is added in the circuit of the RGC-type TIA to control a linearity state of the RGC-type TIA, and a main voltage gain is controlled in other circuit blocks after the RGC-type TIA.

15 Claims, 11 Drawing Sheets

(51) Int. Cl.
*H03F 1/02* (2006.01)
*H03F 1/22* (2006.01)
*H03F 3/45* (2006.01)

(52) U.S. Cl.
CPC ....... *H03F 3/45197* (2013.01); *H04B 10/673* (2013.01); *H03F 3/08* (2013.01); *H03F 3/085* (2013.01); *H03F 2200/435* (2013.01)

(58) Field of Classification Search
CPC ... H04B 10/673; H03G 1/0047; H03G 3/3084
USPC .......................................................... 330/308
See application file for complete search history.

(56) References Cited

U.S. PATENT DOCUMENTS

| | | | |
|---|---|---|---|
| 6,876,260 B2* | 4/2005 | Visocchi | H03F 3/08 330/308 |
| 7,279,985 B2 | 10/2007 | Chang et al. | |
| 8,238,761 B2* | 8/2012 | Liu | H04B 10/6911 398/202 |
| 8,445,832 B2* | 5/2013 | Takemoto | H03F 1/223 330/308 |
| 2002/0041417 A1 | 4/2002 | Han et al. | |
| 2003/0194243 A1 | 10/2003 | Doh et al. | |

FOREIGN PATENT DOCUMENTS

| | | |
|---|---|---|
| KR | 100574969 B1 | 5/2006 |
| KR | 100640413 B1 | 10/2006 |

\* cited by examiner

REGULATED CASCODE (RGC)-TYPE BURST MODE OPTIC PRE-AMPLIFIER HAVING EXTENDED LINEAR INPUT RANGE

CROSS-REFERENCE TO RELATED APPLICATION(S)

This application claims priority from Korean Patent Application No. 10-2014-0159096, filed on Nov. 14, 2014, in the Korean Intellectual Property Office, the entire disclosure of which is incorporated herein by reference for all purposes.

BACKGROUND

1. Field

The following description relates to a burst-mode optical receiver and, more particularly, to a burst-mode optic pre-amplifier having an extended linear input range.

2. Description of the Related Art

Fiber to the home (FTTH) is a generic method of providing an optical line all the way to home in order to transmit more information more rapidly. A Passive Optical Network (PON) is developed to establish FTTH with low costs. In addition, various PON technologies, including EPON- and GPON-related ones, have been standardized or already used. The examples of the PON technologies include 10 Gbit/s Ethernet Passive Optical Network (10 G-EPON) 40-Gigabit-capable passive optical networks (NG-PON2).

A PON mainly consists of an Optical Line Terminal (OLT), an Optical Distribution Network (ODN), and an Optical Network Unit (ONU). As many subscribers use a single time-division multiplexed optical line, an ONU signal transmitted by each home composes predetermined time unit packet data and a combination of the unit packets including a null signal is temporally divided so as to be input to the OLT side. However, path loss occurs in a signal received by the OLT side due to a distance between the ONU side and the OLT side, so that packet signals have different size and phase. These signals are called burst data signals. To compensate for an inconsistent level of an optical input signal, a Burst Mode Trans-Impedance Amplifier (BM-TIA) is necessarily required in the front element of a receiving end on the OLT side. The BM-TIA has to have a wide dynamic range to compensate for signals of various size and prevent non-linear properties.

FIG. 1 is a block diagram illustrating a general BM-TIA using a feedback resistor.

Referring to FIG. 1, a general BM-TIA 1 is a combination of a Trans-Impedance Amplifier (TIA) 10 and a feedback resistor RF 12, and controls entire gains of an amplifier by adjusting a value of the feedback resistor RF 12. A peak detector 14 monitors an output voltage $v_{out1}$ of a TIA 20 to compare the output voltage $v_{out1}$ with a reference voltage $V_{ref}$, and transmits information on whether to perform gain controlling to the feedback resistor RF. Gain controlling is generally performed in two steps, so an ON/OFF signal determining only a large or small gain is output. Since a gain is controlled by size of an input signal, a wider dynamic range may be secured, compared to the case where a single gain is controlled. If a soft burst packet signal of small size is input to the TIA 10, a value of the feedback resistor RF 12 is controlled to increase in an attempt to increase a gain. Alternatively, if a loud burst packet of large size is input, a value of the feedback resistor RF 12 is controlled to be reduced in an attempt to reduce a gain. The TIA 10, which is a current-voltage conversion amplifier, amplifies week current $I_{in}$ that is a current signal which has been converted from an optical signal through a photo diode (PD). Then, the TIA 10 transmits, to a next circuit block, the amplified week current $I_{in}$ in the form a signal of a voltage $V_{out1}$. Since a gain is determined by adjusting a value of the feedback resistor RF 12, circuit stabilization of the TIA 10 heavily depends on the value of the feedback resistor RF 12. Thus, a structure where a phase margin is dramatically changed by variation or a gain, thereby seriously affecting circuit stability, is not suitable for the TIA 10.

FIG. 2 is a diagram illustrating a circuit structure of a general common source-type BM-TIA.

Referring to FIG. 2, a common source type BM-TIA 2 is a more widely used circuit structure than a common gate type or common drain type BM-TIA. A common source type optical pre-amplifier using a feedback resistor RF 20 is capable of freely adjusting a gain and easily securing a wide dynamic range. However, the feedback resistor RF 20 on a current path may cause huge noise, and the common source type BM-TIA 2 does not have a wide bandwidth because of a large input parasitic capacitance. In addition, a BM-TIA is located at the front end in the OLT side, and noise figure and a bandwidth of the front end most affects the entire system. Thus, there is need for a new circuit structure which has lower noise figure and a wider bandwidth, compared to the existing common source structure.

SUMMARY

The following description relates to a Burst Mode Trans-Impedance Amplifier (BM-TIA) with a low noise figure, a wide bandwidth, and an extended linear input range.

In one general aspect, there is provided a burst mode optic pre-amplifier including: a Regulated Cascode (RGC) type Trans-Impedance Amplifier (TIA), wherein a current path is added in the circuit of the RGC-type TIA to control a linearity state of the RGC-type TIA, and a main voltage gain is controlled in other circuit block after the RGC-type TIA.

The current path may include a switch connected to an input node of the RGC-type TIA in parallel, and a current source connected to the input node of the RGC-type TIA in parallel and to the switch in serial; and the current path may extend a linear input range of the RGC-type TIA. The current path may further extend the linear input range of the RGC-type TIA by adjusting a current value of the current source. The current path may further extend the linear input range of the RGC-type TIA by providing a plurality of current sources arranged in parallel so as to adjust a gain in multiple steps.

The burst mode optic pre-amplifier may further include: a TIA configured to convert a received current signal into a voltage signal and amplify the signal; a Single to Differential (S2D) amplifier configured to converts the single voltage signal from the TIA into a first differential signal and amplify the signal; an Auto Offset Cancellation (AOC) amplifier provided appropriate amplification of a second differential signal without waveform distortion by removing a DC-offset in the signal; a buffer amplifier configured to output a final differential output signal by receiving and amplifying the second differential signal; a peak detector configured to provide a discrimination value by detecting a level of a peak value of the voltage signal received from the TIA; and a digital controller configured to provide a first control voltage signal to the S2D amplifier and the buffer amplifier and a second control voltage signal to the TIA by receiving the discrimination value from the peak detector, wherein the first control voltage signal is for controlling a voltage gain of the S2D amplifier and the buffer amplifier, and the second control voltage signal is for distributing an input current of the RGC core circuit so as to extend a linear input range of the RGC-type TIA.

Once a loud burst packet signal is applied, the TIA may turn on the switch by causing the digital controller to output the second control voltage and distributes the loud input current to the current source connected to the switch so as to be extended the linear input range of the RGC-type TIA.

The RGC amplifier may include: a first current source supply transistor configured in a manner in which a source is connected to a first ground voltage, a drain is connected to the input node, and a bias voltage is applied to a gate; a first NMOS transistor configured in a manner in which a source is connected to the input node, a drain is connected to a first resistor, and a gate is connected to an output node of a RGC feedback amplifier, wherein the RGC feedback amplifier comprises: a second NMOS transistor configured in a manner in which a drain is connected to a second resistor as an output node of the RGC feedback amplifier, a source is connected to a second ground power, and a gate is connected to an input node of the RGC amplifier; and the second resistor formed between the output node of the RGC feedback amplifier and a second power voltage; and the first resistor connected between the drain of the first NMOS transistor and a first power voltage, wherein an output voltage is output through an output node between the first resistor and the first NMOS transistor.

The S2D amplifier may include a gain controller configured to receive the first control voltage signal from the digital controller and adjusts a gain of the S2D amplifier in accordance with a source degeneration resistance value; and a phase calibrator configured to calibrate a phase difference symmetrically between output differential signals.

The gain controller may include: a first transistor configured in a manner in which a source is connected to a ground voltage, a drain is connected to a third transistor, and a bias voltage is input to a gate; a second transistor configured in a manner in which a source is connected to the ground voltage, a drain is connected to a fourth transistor, and the bias voltage is input to a gate; the third transistor configured in a manner in which a source is connected to the first transistor, a drain is connected to the first resistor, and an output voltage of the TIA is input to a gate; the fourth transistor configured in a manner in which a source is connected to the second transistor, a drain is connected to the second resistor, and an output voltage of a dummy TIA to a gate; a source degeneration resistor formed between the sources of the third transistor and the fourth transistor, and having a resistance value to be determined by the first control voltage; the first resistor formed between the power voltage and the third transistor; the second resistor formed between the power voltage and the fourth transistor; a first output node formed between the third transistor and the first resistor and configured to output a first negative signal; and a second output node formed between the fourth transistor and the second resistor and configured to output a first positive signal.

The phase calibrator may include a fifth transistor formed between the first output node and the second output node and a first capacitor formed between a switch connected to the first output node and the power voltage; and the switch connected to the first output node may be controlled by the first control voltage signal which is the same as a voltage that controls the source degeneration resistor and the gate of the fifth transistor, and the first capacitor compensate for a phase difference between the first negative signal and the first positive signal of the gain controller by delaying a phase of a value of the first negative signal as much as a phase of a voltage applied to the fourth transistor is delayed.

The phase calibrator may further include: a sixth transistor configured in a manner in which a source is connected to the ground voltage, a drain is connected to a source of an eighth transistor, and the bias voltage is input to a gate; a seventh transistor configured in a manner in which a source is connected to the ground voltage, a drain is connected to a source of a ninth transistor, and the bias voltage is input to a gate; the eighth transistor configured in a manner in which the source is connected to the drain of the sixth transistor, a drain is connected to a third resistor, and a gate is connected to the first output node; the ninth transistor configured in a manner in which the source is connected to the drain of the seventh transistor and the drain of the sixth transistor, a drain is connected a fourth resistor, and a gate is connected to the second output node; a tenth transistor configured in a manner in which a source is connected to the ground voltage, a drain is connected to a source of a twelfth transistor, the bias voltage is input to a gate; an eleventh transistor configured in a manner in which the source is connected to the drain of the tenth transistor, and the bias voltage is input to a gate; the third resistor formed between the power voltage and the drain of the eighth transistor; the fourth resistor formed between the power voltage and the drain of the ninth transistor; a third output node formed in the drain of the eighth transistor and configured to output a second positive signal; a fourth output node formed in the drain of the ninth transistor and configured to output a second negative signal; the twelfth transistor configured in a manner in which the source is connected to the tenth transistor, the drain is connected to a gate of a thirteenth transistor and the third output node, and a gate is connected to a drain of the thirteenth transistor; the thirteenth transistor configured in a manner in which the source is connected the drain of the eleventh transistor, the drain is connected to the gate of the twelfth transistor and the fourth output node, and the gate is connected to the drain of the twelfth transistor; a second capacitor formed between the ground voltage and the drain of the tenth transistor; and a third capacitor formed between the power voltage and the drain of the eleventh transistor.

In order to prevent the TIA from malfunctioning which occurs when entire DC values become unstable due to the first control voltage signal in a state having a null value, which mean there is no signal, for a reset period, the digital controller may transmit the second control voltage signal to the TIA to control switching of the TIA so that the peak detector detects a loud burst packet signal after the reset period to enable the TIA to operate only in a low gain mode.

The digital controller may include: a first latch configured to output a predetermined output value ($\overline{Q}$) by receiving the discrimination value output from the peak detector at node R and an MAC reset signal at node S; a first inverter configured to outputs the first control voltage signal by inverting the output value ($\overline{Q}$) of the first latch; a second latch connected to the ground voltage at node R and output a predetermined output value by receiving the MAC reset signal at node S; an NAND block configured to output an output value of an NAND circuit by receiving the output value (Q) of the first latch and the output value of the second latch; and a second inverter configured to output the second control voltage signal by inverting the output value of the NAND block.

The burst mode optic pre-amplifier may further include: a dummy TIA having a same structure of the TIA without the input signal and configured to transmit a dummy voltage to the peak detector and the S2D amplifier, wherein the dummy TIA extends the linear input range of the RGC-type TIA as well by receiving the second control voltage signal from the digital controller for distributing an input current of the dummy TIA.

Other features and aspects may be apparent from the following detailed description, the drawings, and the claims.

Figure 1:
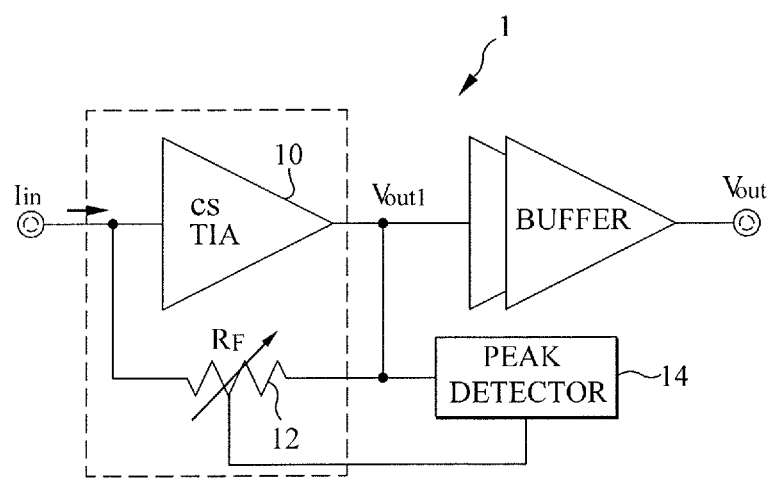
FIG. 1 is a block diagram illustrating a general burst mode trans-impedance amplifier (BM-TIA) using a feedback resistor.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

The present disclosure applies a Regulated Cascode (RGC) structure, instead of a common source structure, to a burst mode optic pre-amplifier so as to improve low noise properties and a bandwidth, and, additionally, a dynamic range. The burst mode optic pre-amplifier may be represented and used as a Burst Mode Trans-Impedance Amplifier (BM-TIA). Hereinafter, a technology for improving a dynamic range with low noise properties and a wide bandwidth is described in detail with reference to the following drawings.

Figure 3:
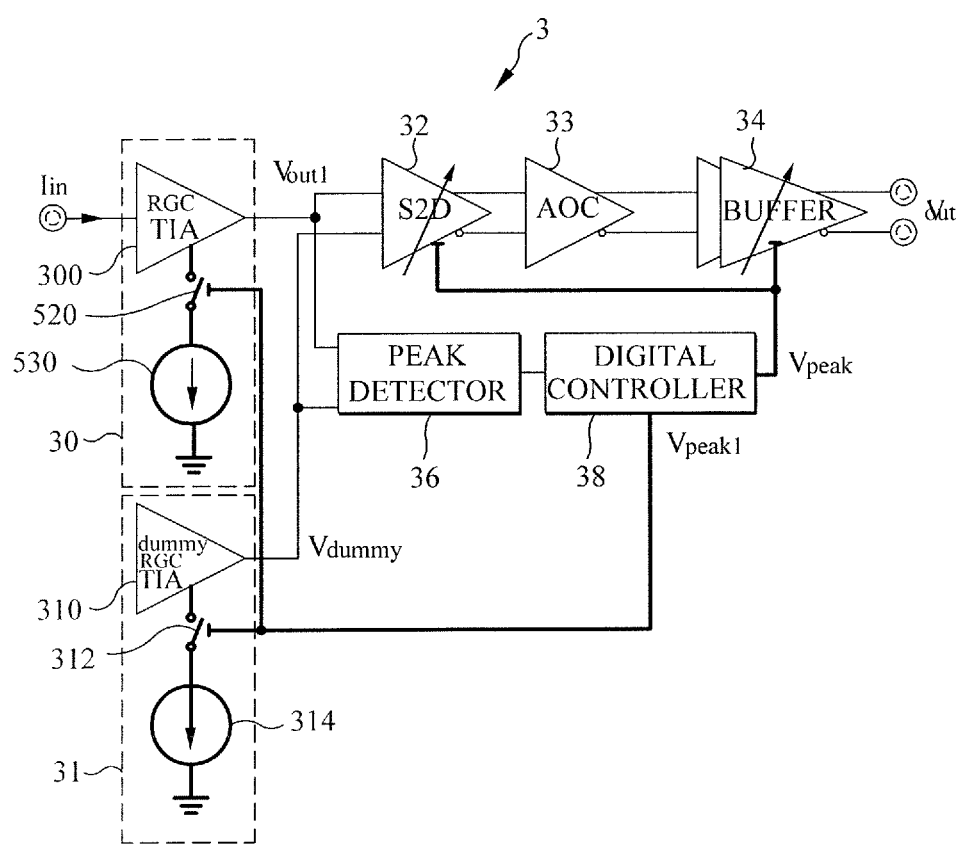
FIG. 3 is a block diagram illustrating a regulated cascode (RGC) type BM-TIA according to an exemplary embodiment of the present disclosure.

FIG. 3 is a block diagram illustrating an RGC-type BM-TIA according to an exemplary embodiment of the present disclosure.

Referring to FIG. 3, an RGC-type BM-TIA 3 includes an RGC-TIA circuit 30, a dummy RGC-TIA circuit 31, a Single to Differential (S2D) amplifier 32, an Auto Offset Cancellation (AOC) amplifier 33, a buffer amplifier 34, a peak detector 36, and a digital control block 38.

According to an exemplary embodiment, a current path including a switch 520 and a current source 530 for an RGC-TIA 300 is added in the RGC-TIA circuit 30. In addition, the dummy RGC-TIA circuit 31 has the same structure of the RGC-TIA circuit 30, and a current path including a switching 312 and a current source 315 are added in a dummy RGC-TIA 310. However, a signal of input current $I_{in}$ is not input in the dummy RGC-TIA circuit 31, unlike the RGC-TIA circuit 30.

The RGC-TIA circuit 30 outputs a signal of the output voltage $V_{out1}$ by converting and amplifying the signal of input current $I_{in}$ through the RGC-TIA 300. The signal of input current $I_{in}$ is received by the RGC-TIA 300 from the photo diode (PD) through optical fibers.

The S2D amplifier 32 converts and amplifies the single signal of the output voltage $V_{out1}$ output from the RGC-TIA 300 into the first differential signal. In order to convert the single signal of the output voltage $V_{out1}$ into the first differential signal, the S2D amplifier 32 receives a dummy voltage $V_{dummy}$, which is an average direct current (DC) value, from the dummy RGC-TIA circuit 31.

The AOC amplifier 33 removes a DC-offset in the signal for a purpose of circuit stabilization, and generates and outputs the second differential signal. The buffer amplifier 34 receives the second differential signal from the AOC amplifier 33 and then outputs the second differential signal to an external device.

In order to detect a loud burst packet signal of large size and a soft burst packet signal of small size, the peak detector 36 monitors a signal of an output voltage $V_{out1}$ of the RGC-TIA 300. At this point, a discrimination value $V_D$ for loud burst/soft burst detected by the peak detector 36 is transmitted to the digital control block 38. Then, the digital control block 38 controls a voltage gain or a state of each amplifier by using control a voltage $V_{peak}$ or $V_{peak1}$. Specifically, the digital control block 38 provides a signal of the first control voltage $V_{peak}$ to the S2D amplifier 32 and the buffer amplifier 34 so as to control voltage gains of the S2D amplifier 32 and the buffer amplifier 34. In addition, the digital control block 38 provides a signal of the second control the voltage $V_{peak1}$ to the RGC-TIA circuit 30 and the dummy RGC-TIA circuit 31 so as to control states of the RGC-TIA 300 and the dummy RGC-TIA 310.

Figure 2:
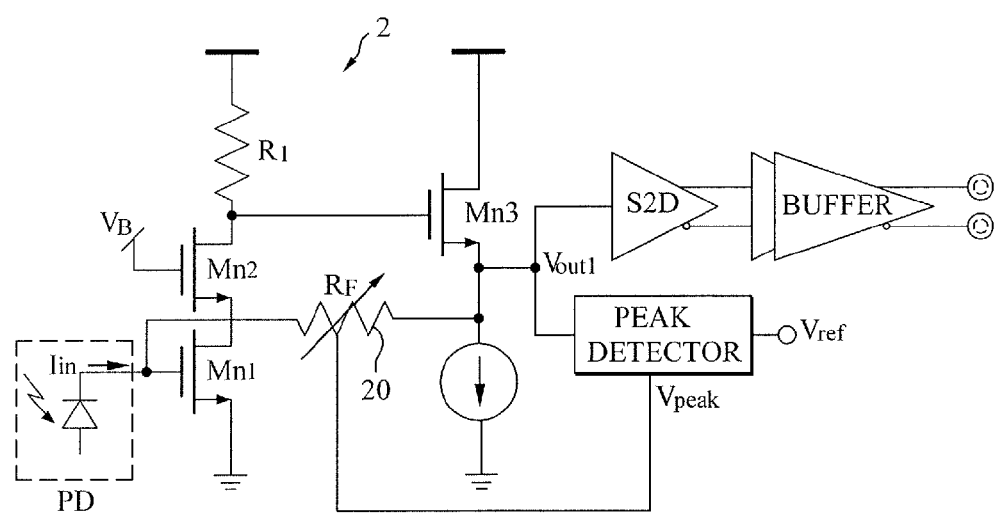
FIG. 2 is a diagram illustrating a circuit structure of a general common source type BM-TIA.

Unlike the existing common source type BM TIA circuit having a feedback resistor described with reference to FIG. 2, the RGC-type BM-TIA 3 according to the present disclosure does not control a gain of the RGC-TIA 300, but provides a current path so as to control gains of the S2D amplifier 32 and the buffer amplifier 34 and to control states of the RGC-TIA circuit 30 and the RGC-TIA circuit 31. It is because of characteristics of an RGC structure. In general, an RGC structure is used for a simple TIA, but hardly used for a BM-TIA because it is difficult to control a gain in the RGC structure. A BM-TIA can easily control a gain by connecting a feedback resistor, and, at this point, a DC value of a circuit node is changed. In contrast, a DC value of an input node is fixed as a specific value in the RGC circuit structure due to characteristics of the RGC circuit structure, so it is impossible to control a gain by connecting an input node and an output node to a feedback resistor. For this reason, the RGC structure is not generally used for a BM-TIA for which it is required to control a gain. Nonetheless, the RGC structure still has many advantages enough to be used as an input side of a BM-TIA. The reason that the present disclosure has adapted an RGC-type TIA will be described in detail when an existing RGC-type TIA is described with reference to FIG. 4.

Figure 4:
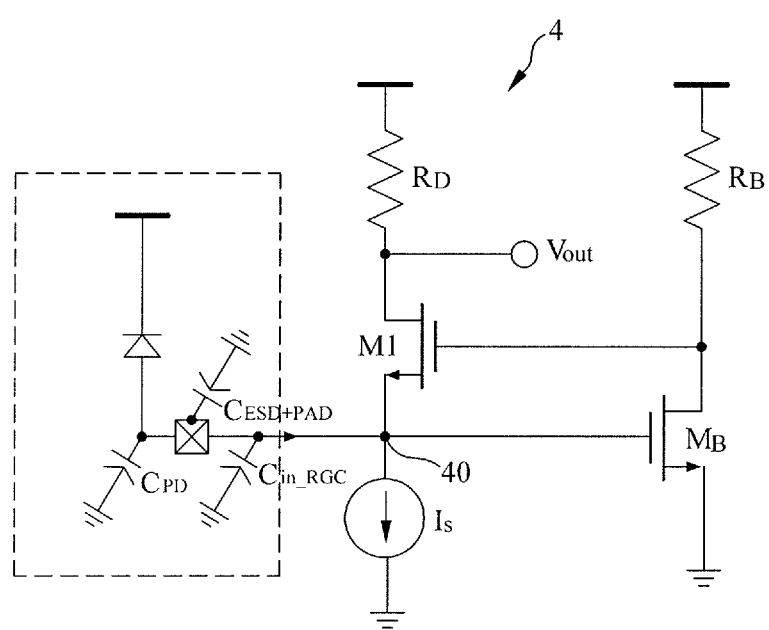
FIG. 4 is a diagram illustrating a circuit structure of an existing RGC TIA.

FIG. 4 is a diagram illustrating a circuit structure of an existing RGC-TIA.

Referring to FIG. 4, there are various parasitic capacitor components in an input node 40 of an existing TIA 4. For example, there are parasitic capacitor $C_{pd}$ of the largest photo diode (PD), a parasitic capacitor in a pad and an ESD circuit (CESD+PAD), and a parasitic capacitor $C_{in}$ of a circuit of the existing TIA 4. These parasitic capacitor components of the input node 40 have values greater than parasitic capacitors of other nodes, and thus, a bandwidth of the entire TIAs is determined to be −3 dB. That is, a bottleneck of a system bandwidth is determined in the input node 40. However, in the RGC circuit, a bandwidth of an amplifying side consisting of a transistor $M_B$ and a resistor $R_B$ may be extended by a loop gain, as shown in the following equation, due to characteristics of a negative feedback circuit that forms a loop through a transistor M1. The greater the gain of a feedback loop becomes, the more the bandwidth is extended.

$$f_{-3dB,input} \cong \frac{g_{m1}(1+g_{mB}R_B)}{2\pi(C_{PD+ESD+PAD}+C_{in,RGC})} \quad (1)$$

In the above equation (1), gm1 denotes transconductance of the transistor M1, and gmB denotes transconductance of the transistor $M_B$.

A result of the above equation is physically represented as below: an input node may have a DC value stabilized by a negative feedback circuit within a circuit so that the input node can be seen in a virtual ground state. In a common source structure, there is not such a negative feedback circuit, but a large capacitor, which can be seen on a gate of an input transistor, so that a bandwidth thereof may be reduced significantly. Therefore, the common source structure is not suitable for a wide bandwidth required for a high-speed operation.

Noise current spectral density of a common source type BM-TIA is proportional to an inverse number of a value of a feedback resistor RF. Thus, the smaller value the feedback resistor RF has, the greater noise properties the common source-type BM-TIA may show. By contrast, an RGC-type BM-TIA does not have such a resistor and its noise current spectral density is disproportional to a gain obtained by a negative feedback circuit. Thus, as shown in the following equation (2), the RGC-type BM-TIA has a relatively low noise figure compared to any general circuit, such as a common-source TIA, a common-drain TIA, and a common-gate TIA.

$$\overline{i_{eq}^2} \propto 4kT(\Gamma g_{do,B}+1/R_B) \times \left[\frac{2\pi f(C_{PD+ESD+PAD}+C_{in,RGC})R_B}{(1+g_{mB}R_B)}\right]^2 \quad (2)$$

In a wireless communication transmitting and receiving system, a Low Noise Amplifier (LNA) is a circuit block that is placed in the front end of a receiving side to perform amplification with low noise. As described above with reference to FIG. 4, a noise value in the first circuit block of an input side determines noise properties of the entire system. The BM-TIA is also is a circuit block located on the front end of a receiving side of an OLT, and thus, noise properties are parameters that should be considered important than anything else.

In addition to an extended bandwidth and low noise properties, as described above, the RGC circuit operates very stably and has an output node with high voltage headroom, so that it has a wide linear range where an output voltage can swing smoothly. Despite these advantages, it is not possible to control a gain in the RGC circuit by using an input/output feedback resistor when providing a variable gain, and thus, a wide dynamic range cannot be secured using the existing technology.

As described above with reference to FIG. 3, in a method proposed by the present disclosure, a gain is controlled in the S2D amplifier 32 and the buffer amplifier 34, which are in the rear side of the RGC-TIA circuit 30, and a current path is provided to control states of the S2D amplifier 32 and the buffer amplifier 34. As a result, non-linearity is prevented and a linear range is extended. Hereinafter, with reference to the following drawings, the RGC-TIA circuit 30, the S2D amplifier 32, and the digital control block 38 shown in FIG. 3 are described in detail.

Figure 5:
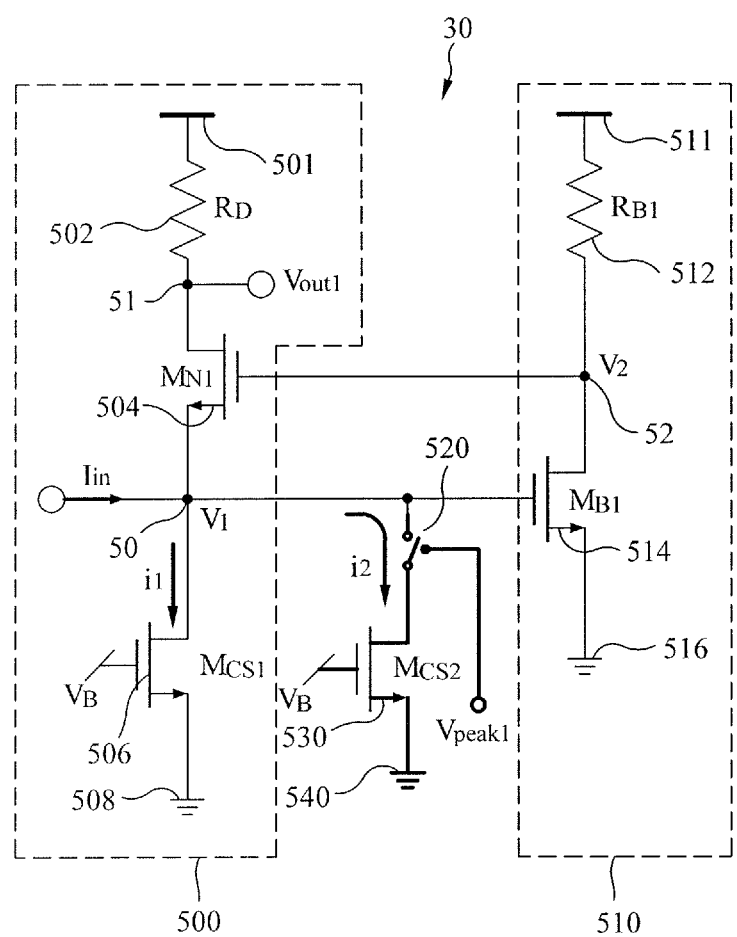
FIG. 5 is a detailed circuit diagram illustrating an RGC-TIA shown in FIG. 3 according to an exemplary embodiment of the present disclosure.

FIG. 5 is a detailed circuit diagram illustrating an RGC-TIA circuit shown in FIG. 3 according to an exemplary embodiment of the present disclosure.

Referring to FIGS. 3 and 5, the RGC-TIA circuit 30 includes an RGC amplifier 500, an RGC feedback amplifier 510, a switch 520, and a second current source supply transistor Mcs2 530.

In the RGC-TIA circuit structure 30, the switch 520 is connected in parallel to an input node 50 of the existing RGC-TIA circuit, while the second current source supply transistor Mcs2 530 is connected to in serial to the input node 50. If a small signal of an input current $I_{in}$ is input through a PD, the switch 520 becomes OFF and then the RGC-TIA circuit 30 performs basic operations as the same way the existing circuit does. However, if a loud burst packet signal is applied and accordingly a large signal of the input current $I_{in}$ is input through the PD, the switch 520 becomes ON in accordance with a signal of the second control voltage $V_{peak1}$ so that current i2 may be distributed to a path to which the large signal of the input current $I_{in}$ can be distributed, that is, the second current source supply transistor Mcs2 530. Accordingly, when the large input current is applied, a drain voltage of the first current source transistor Mcs1 506, that is a voltage V1 of an input node, increases to thereby prevent malfunction of the RGC circuit. As a result, the RGC circuit may operate stably. It does not cause a gain to change, but may cause a common DC value of an output node to change slightly. To detect change of the DC value and alleviate impact thereof, the S2D amplifier 32 receives a common DC value having no signal through the other input port of a differential amplifier structure. The common DC value is output from the dummy RGC-TIA circuit 31 having the same structure the RGC-TIA circuit 30, and changes as much as a DC value output from the RGC-TIA circuit changes. Therefore, a change in a point in time of outputting a common DC value may be alleviated, and thus, the change may be ignored in the next stage.

Hereinafter, the RGC-TIA circuit 30 having an additional current path is described in detail with reference to FIG. 5.

Referring to FIG. 5, the RGC-TIA circuit 30 includes the RGC amplifier 500, the RGC feedback amplifier 510, the switch 520, and the second current supply transistor (Mcs2) 530.

The RGC amplifier 500 outputs a signal of an output voltage $V_{out1}$ by converting and amplifying a signal of input current $I_{in}$. The RGC feedback amplifier 510 is connected to the input node 50 of the RGC amplifier 500, amplifies the signal of input current $I_{in}$, and provides negative feedback to the RGC amplifier 500.

Specifically, the RGC amplifier 500 includes a first resistor $R_D$ 502, a first NMOS transistor $M_{N1}$ 504, a first current resource supply transistor $M_{cs1}$ 506, and a first ground voltage 508. The Mcs1 506 is configured in a manner where a source is connected to the first ground voltage 508, a drain is connected to the input node 50 of the RGC amplifier 500, and a bias voltage $V_B$, which is a DC voltage, is applied to a gate. The first NMOS transistor $M_{N1}$ 504 is configured in a manner in which a source is connected to the input node 50 of the RGC amplifier 500, a drain is connected to the first register $R_D$ 502, and a gate is connected to the output node 52 of the RGC feedback amplifier 510. The first register $R_D$ 502 is connected between the drain of the first NMOS transistor $M_{N1}$ 504 and the first power voltage 501. An output voltage $V_{out1}$ is output through the output node 51 between the first register RD 502 and the first NMOS transistor $M_{N1}$ 504.

The RGC feedback amplifier 510 includes a second power voltage 511, a second register $R_{B1}$ 512, a second NMOS transistor $M_{B1}$ 514, and a second ground voltage 516. The second NMOS transistor $M_{B1}$ 512 is configured in a manner in which a drain is connected to a second resistor as the output node 52, a source is connected to the second ground voltage 516, and a gate is connected to the input node 50 of the RGC amplifier 500. The second register 512 is formed between the output node 52 of the RGC feedback amplifier 510 and the second power voltage 511.

The switch 520 is located between the second current source supply transistor Mcs2 530 and a node which is between an input node 50 of the RGC amplifier 500 and a gate of the second NMOS transistor MB1 512. Therefore, the switch 520 is connected to the input node 50 of the second current resource supply transistor $M_{cs2}$ 530 in parallel. The second current source supply transistor $M_{cs2}$ 530 is connected to the switch 520 in serial and formed between the switch 520 and a third ground voltage 540.

Figure 6:
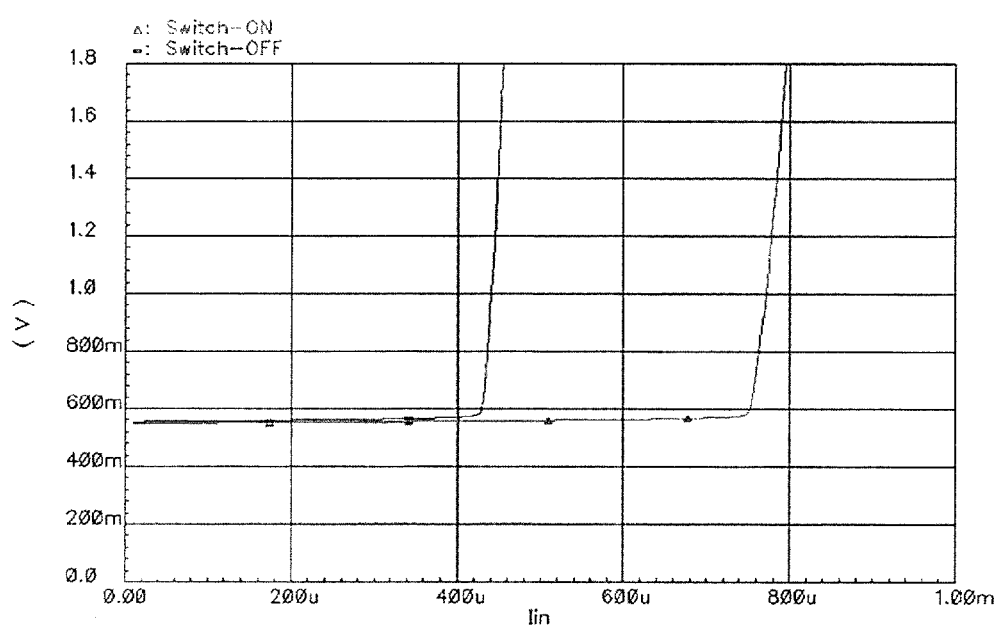
FIG. 6 is a graph illustrating simulation about how a DC value of an input node is changed in response to input of a current in order to check improvement in a dynamic range of an RGC-TIA according to an exemplary embodiment of the present disclosure.

FIG. 6 is a graph illustrating simulation about how a DC value of an input node is changed in response to input of a current in order to check improvement in a dynamic range of an RGC-TIA according to an exemplary embodiment of the present disclosure.

Referring to FIG. 6, a section where a constant DC value is maintained on the vertical axis is a section where the RGC circuit operates properly. When an additional current path is provided and thus a switch becomes ON, a linear range for receiving an input current has been extended more than when the switch is OFF. The case where the switch is OFF is related to characteristics of the existing technology, and the case where the switch is ON is related to effects of the present disclosure. The simulation result shown reference to FIG. 6 is an example where performance of the present invention is revealed. To secure a further wider linear input range, it may be possible to adjust a current value of an added current source and to add current sources so as to control a gain in multiple steps.

Figure 7:
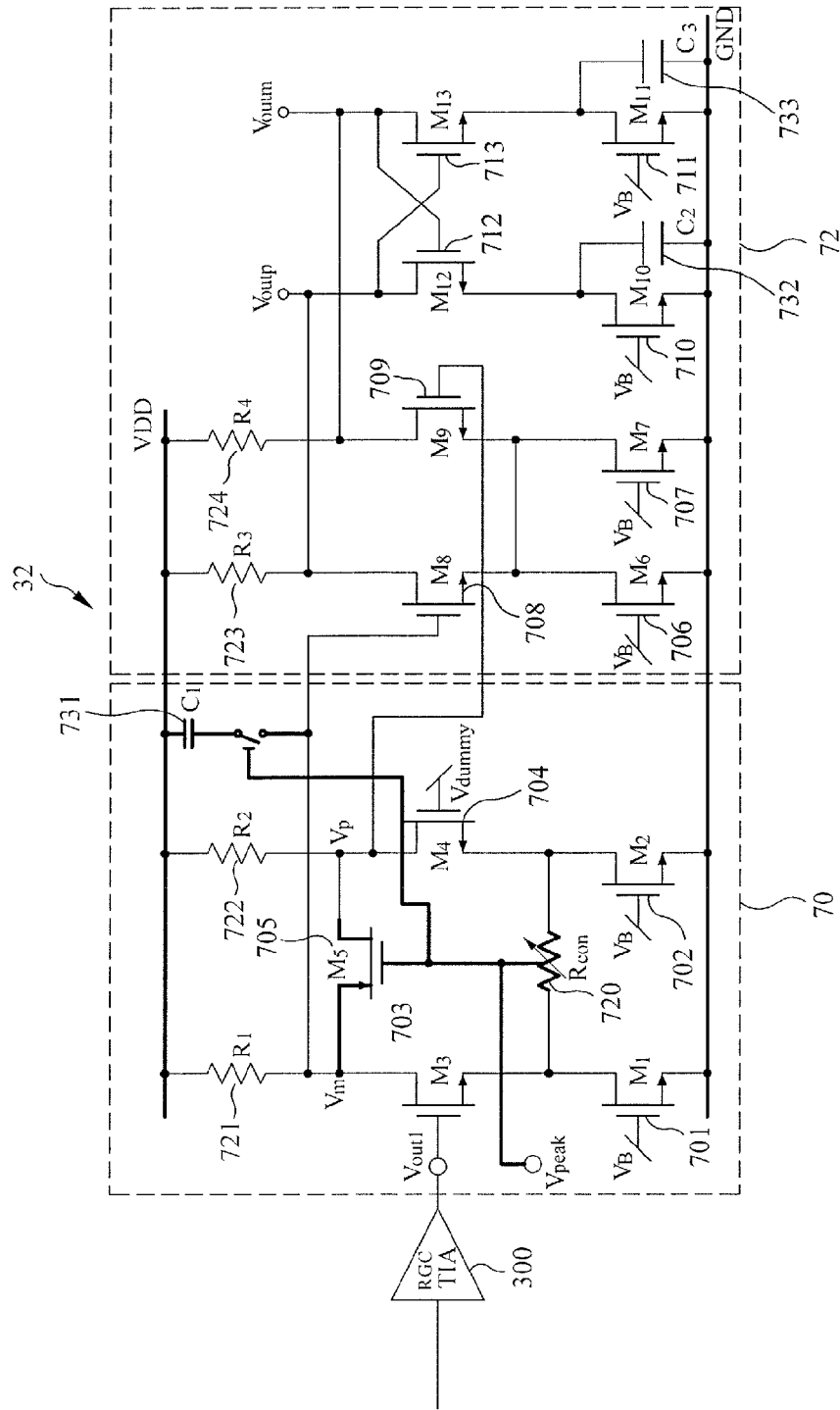
FIG. 7 is a detailed circuit diagram illustrating a single to differential (S2D) amplifier shown in FIG. 3 according to an exemplary embodiment of the present disclosure.

FIG. 7 is a detailed circuit diagram illustrating a S2D amplifier shown in FIG. 3 according to an exemplary embodiment of the present disclosure.

Referring to FIGS. 3 and 7, the S2D amplifier 32 includes a gain controller 70 and a phase calibrator 72.

The gain controller 70 includes first to fourth transistors $M_1$ to $M_4$ 701 to 704, the first resistor R1 721, the second resistor R2 722, and a source degeneration resistor $R_{con}$ 720. The phase calibrator 72 includes sixth to thirteenth transistors $M_6$ to $M_{13}$ 706 to 713, a third resistor $R_3$ 723, a fourth resistor $R_3$ 724, a second capacitor $C_2$ 732, and a third capacitor $C_3$ 733. The gain controller 70 may further include a fifth transistor $M_5$ 705 and a first capacitor $C_1$ 731, which are required to calibrate a phase difference in the gain controller 70.

The gain controller 70 determines a voltage gain by controlling the source degeneration resistor $R_{con}$ 720 within a differential amplifier. The gain controller 70 adjusts a value of the source degeneration resistor $R_{con}$ 720 by receiving a signal of the first control voltage $V_{peak}$ generated according to a result of determination of a level of a burst packet signal which has come through the peak detector 36 and the digital controller 38. A gain is generally controlled in two steps, and thus, a value of the signal of the first control voltage $V_{peak}$ is ON or OFF, and the source degeneration resistor $R_{con}$ 720 has two predetermined resistor values. In the case of controlling a gain in three steps, a resistor value needs to be adjusted three times.

The fifth transistor $M_5$ 705 and the first capacitor $C_1$ 731 in the gain controller 70 compensate for a phase difference between signals. Although the phase calibrator 72 generates differential symmetrized signals $V_{outp}$ and $V_{outm}$ from a single signal, the fifth transistor $M_5$ 705 and the first capacitor $C_1$ 731 compensates for a phase difference between differential symmetrized signals $V_{outp}$ and $V_{outm}$ by elaborately moving the phase in a low gain mode so as to generate perfect differential signals. The phase compensation is necessary in a low gain mode because of asymmetry of the negative signals $V_m$ and $V_p$, which is led by a value of the source degeneration resistor $R_{con}$ 720. If the first transistor $M_1$ 701 and the second transistor $M_2$ 702 are considered ideal current sources, the output signal $V_{out1}$ of an RGC TIA, which is input through a gate of the third transistor $M_3$ 703, is distributed to a gate-source $V_{GS\_M3}$ of the third transistor $M_3$ 703, both ends of the source degeneration resistor $R_{con}$ 720, and a source-gate $V_{SG\_M4}$ of the fourth transistor $M_4$ 704. A value of $V_{dummy}$ input through a gate of the fourth transistor $M_4$ 704 is a DC value, and thus, it is an ideal AC ground value.

Since a value of the source degeneration resistor $R_{con}$ 720 is small in a high gain mode, most voltage is applied to gate-sources of the third transistor $M_3$ 703 and the fourth transistor $M_4$ 704. Thus, the differential signal $V_p$ and $V_m$ are asymmetrical to each other. However, value of the source degeneration resistor $R_{con}$ 720 increases in a low gain mode to reduce a gain, so that a slight phase delay of a voltage applied to the fourth transistor $M_4$ 704 occurs. To solve this problem, a phase of an output value of the signal $V_m$ is delayed as much as a phase of a voltage $V_{SG\_M4}$ applied to a source-gate of the fourth transistor $M_4$ 704 is delayed in a low gain mode.

Meanwhile, gain controlling by the buffer amplifier 34 also needs to be implemented by controlling a gain using the first control voltage $V_{peak}$. As there are various methods for controlling a buffer gain, detailed descriptions thereof are not provided in the present disclosure.

Hereinafter, a detailed configuration of the gain controller 70 is described.

Referring to FIG. 7, the gain controller 70 includes the first to fourth transistor $M_1$ to $M_4$ 701 to 704, the first resistor $R_1$ 721, the second resistor $R_2$ 722, and the source degeneration resistor $R_{con}$ 720.

The first transistor $M_1$ 701 is configured in a manner in which a source is connected to a ground voltage GND, a drain is connected to the third transistor $M_3$ 703, and a bias voltage $V_B$ is input to a gate. The second transistor $M_2$ 702 is configured in a manner in which a source is connected to the ground voltage GND, a drain is connected to the fourth transistor $M_4$ 704, and the bias voltage $V_B$ is input to a gate.

The third transistor $M_3$ 703 is configured in a manner in which a source is connected to the first transistor $M_1$ 701, a drain is connected to the first resistor $R_1$ 721, and the output voltage $V_{out1}$ of an RGC-TIA is input to a gate. The fourth transistor $M_4$ 704 is configured in a manner in which a source is connected to the second transistor $M_2$ 702, a drain is connected to the second resistor $R_2$ 722, and an output voltage $V_{dummy}$ of a dummy RGC-TIA is input to a gate.

The source degeneration resistor $R_{con}$ 720 is formed between a source of the third transistor $M_3$ 703 and a source of the fourth transistor $M_4$ 704. A value of the source degeneration resistor $R_{con}$ 720 is determined by the first control voltage $V_{peak}$ received from the digital controller 38. The first resistor $R_1$ 721 is formed between the power voltage VDD and the third transistor $M_3$ 703, and the second resistor $R_2$ 722 is formed between the power voltage VDD and the fourth transistor $M_4$ 704. The first output node is formed between the third transistor $M_3$ 703 and the first resistor $R_1$ 721 to output the first differential signal $V_m$, and the second output node is formed between the fourth transistor $M_4$ 704 and the second resistor $R_2$ 722 to output the first positive signal $V_p$.

Hereinafter, a detailed configuration of the phase calibrator 72 is described.

The phase calibrator 72 includes the sixth to thirteenth transistor $M_6$ to $M_{13}$ 706 to 713, the third resistor $R_3$ 723, the fourth resistor $R_4$ 724, the second capacitor $C_2$ 732, and the third capacitor $C_3$ 733.

Specifically, the sixth transistor $M_6$ 705 is configured in a manner in which a source is connected to the ground voltage GND, a drain is connected to the eighth transistor $M_8$ 708, and the bias voltage $V_B$ is input to a gate. The seventh transistor $M_7$ 707 is configured in a manner in which a source is connected to the ground voltage GND, a drain is connected to a source of the ninth transistor $M_9$ 709, and the bias voltage $V_B$ is input to a gate. The drain of the sixth transistor $M_6$ 706 and the drain of the seventh transistor $M_7$ 707 are connected to each other.

The eighth transistor $M_8$ 708 is configured in a manner in which a source is connected to the drain of the sixth transistor $M_6$ 706, a drain is connected to the third resistor $R_3$ 723, and a gate is connected to the first output node. The ninth transistor $M_9$ 709 is configured in a manner in which a source is connected to the drain of the seventh transistor $M_7$ 707 and the drain of the sixth transistor, a drain is connected to the fourth resistor $R_4$ 704, and a gate is connected to the second output node.

The tenth transistor $M_{10}$ 710 is configured in a manner in which a source is connected to the ground voltage GND, a drain is connected to a source of the twelfth transistor $M_{12}$ 712, and the bias voltage $V_B$ is input to a gate. The eleventh transistor $M_{11}$ 711 is configured in a manner in which a source is connected to the ground voltage GND, a drain is connected to a source of the thirteenth transistor $M_{13}$ 713, and the bias voltage $V_B$ is input to a gate.

The third resistor $R_3$ 723 is formed between the power voltage VDD and the drain of the eighth transistor $M_8$ 708, and the fourth resistor R4 is formed between the power voltage VDD and the drain of the ninth transistor $M_9$ 709. The third output node is formed in the drain of the transistor $M_8$ 708 to output the third differential signal $V_{outp}$. The fourth output node is formed in the drain of the ninth transistor $M_9$ 709 to output $V_{outm}$. The differential signals $V_{outp}$ and $V_{outm}$ are symmetrical to each other.

The twelfth transistor $M_{12}$ 712 is configured in a manner in which a source is connected to the tenth transistor $M_{10}$ 710, a drain is connected to the thirteenth transistor $M_{13}$ 713 and the third output node, and a gate is connected to a drain of the thirteenth transistor $M_{13}$ 713. The transistor $M_{13}$ 713 is configured in a manner in which a source is connected to the eleventh transistor $M_{11}$ 711, a drain is connected to a gate of the twelfth transistor $M_{12}$ 712, and a gate is connected to a drain of the twelfth transistor $M_{12}$ 712.

The second capacitor $C_2$ 732 is formed between the ground voltage GND and the tenth transistor $M_{10}$ 710, and the third capacitor $C_3$ 733 is formed between the ground voltage GND and the drain of the eleventh transistor $M_{11}$ 711.

Meanwhile, the phase calibrator 72 includes the fifth transistor $M_5$ 705 and the first capacitor $C_1$ 731, which are required to calibrate a phase difference in the gain controller 70.

Specifically, the fifth transistor $M_5$ 705 is formed between the first output node and the second output node. The first capacitor C1 731 is formed between a switch connected to the first output node and the ground voltage VDD. The switch is controlled by the first control voltage $V_{peak}$ received from the digital controller 38, which is the same as a voltage that controls the source degeneration resistor $R_{con}$ 720 and the gate of the fifth transistor. The first capacitor C1 731 compensates for a phase difference between the first differential signal $V_m$ and the second differential signal $V_p$ by delaying a phase of the first differential signal $V_m$ as much as a phase of a voltage applied to the fourth transistor $M_4$ 704 is delayed.

Figure 8:
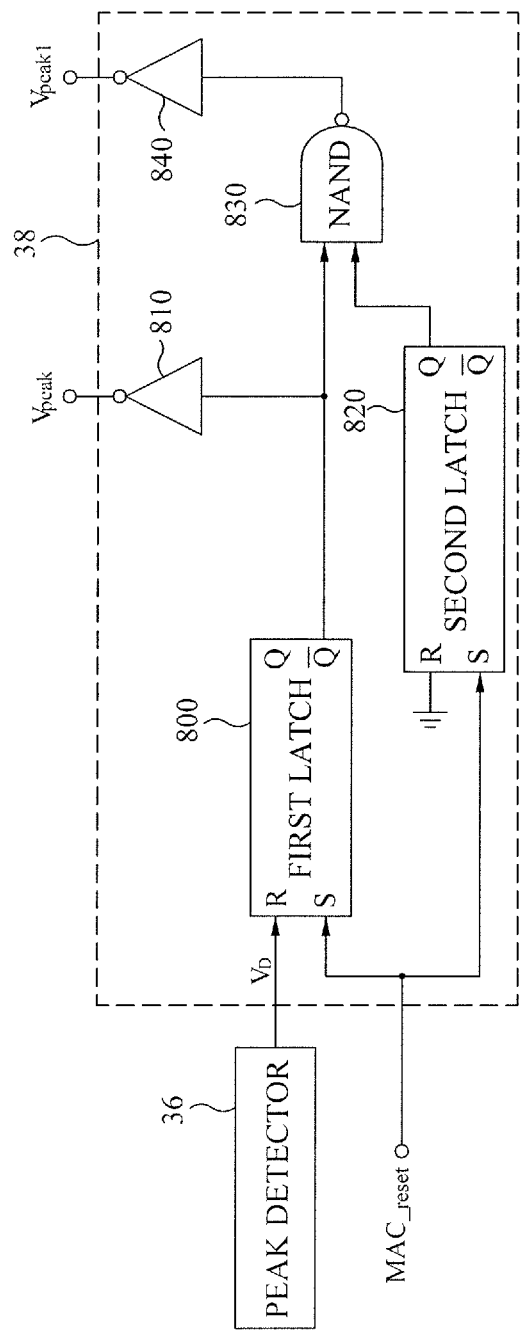
FIG. 8 is a detailed circuit diagram illustrating a digital controller shown in FIG. 3 according to an exemplary embodiment of the present disclosure.

FIG. 8 is a circuit diagram illustrating a digital controller shown in FIG. 3 according to an exemplary embodiment of the present disclosure.

Referring to FIGS. 3 and 8, the digital controller 38 receives output of the peak detector 36 and a reset signal $MAC_{\_reset}$, and outputs values of two control voltage $V_{peak}$ and $V_{peak1}$. The first control voltage $V_{peak}$ is for controlling voltage gains of the S2D amplifier 32 and the buffer amplifier 34. The digital controller 38 stores a result obtained by the peak detector 36 in a first latch 800, and outputs the first control voltage $V_{peak}$ by controlling a signal of the first control voltage $V_{peak}$ to go through a first inverter 810.

Specifically, the first latch 800 receives a discrimination value $V_D$ from the peak detector 36 at node R and a reset signal $MAC_{\_reset}$ at node S from a Medium Access Control (MAC) layer. For example, R input is the discrimination value $V_D$, and S input is the signal $MAC_{\_reset}$. The first latch 800 outputs $\overline{QQ}$output in response to RS input. A single output value from the first latch 800, for example, $\overline{QQ}$output value, is input to the inverter 810, and then the inverter 810 inverts $\overline{QQ}$output value and outputs a result of the inversion. The output value from the inverter 810 corresponds to the first control voltage $V_{peak}$.

The second control voltage $V_{peak1}$ is for extending a linear input range of an RGC-TIA. A second latch 820 receives a reset signal MAC$_{\_rest}$, and a NAND block 830 receives an output value of the first latch 800 and an output value of the second latch 820 to output the second control voltage $V_{peak1}$ through a second inverter 840.

Specifically, the second latch 820 is connected to the ground voltage and receives a signal MAC$_{\_rest}$. For example, R input is the ground voltage and S input is the signal MAC$_{\_rest}$. The second latch 820 outputs output Q and $\overline{Q}$ in response to RS input. A single output value of the second latch 820, for example, Q output value, is input to the NAND block 830.

The NAND block 830 receives an output value of the first latch 800 and an output value of the second latch 820 to output an output value of an NAND circuit. An output value of the NAND block 830 is input to the second inverter 840, and then the second inverter 840 inverts the output value and outputs a result of the inversion. An output value of the second inverter 840 corresponds to the second control voltage $V_{peak1}$.

The reason that the digital controller 38 generates a value of the second control voltage $V_{peak1}$, which is different from a value of the first control voltage $V_{peak}$, is to prevent an RGC-TIA 300 from malfunctioning which may occur when DC values of an amplifier become unstable due to a meaningless value of the first control voltage in a state having a null value, which means that there is no signal, for duration of the reset signal MAC$_{\_reset}$ signal. Thus, to allow the RGC-TIA 300 and the RGC-TIA 31 to operate only in a low gain mode, switching of the current source supply transistors of the RGC-TIA 300 and the RGC-TIA 31 is controlled by the second control voltage $V_{peak1}$, which is provided by the digital controller 38, by detecting a loud burst packet signal after occurrence of the MAC$_{\_reset}$ signal.

Figure 9:
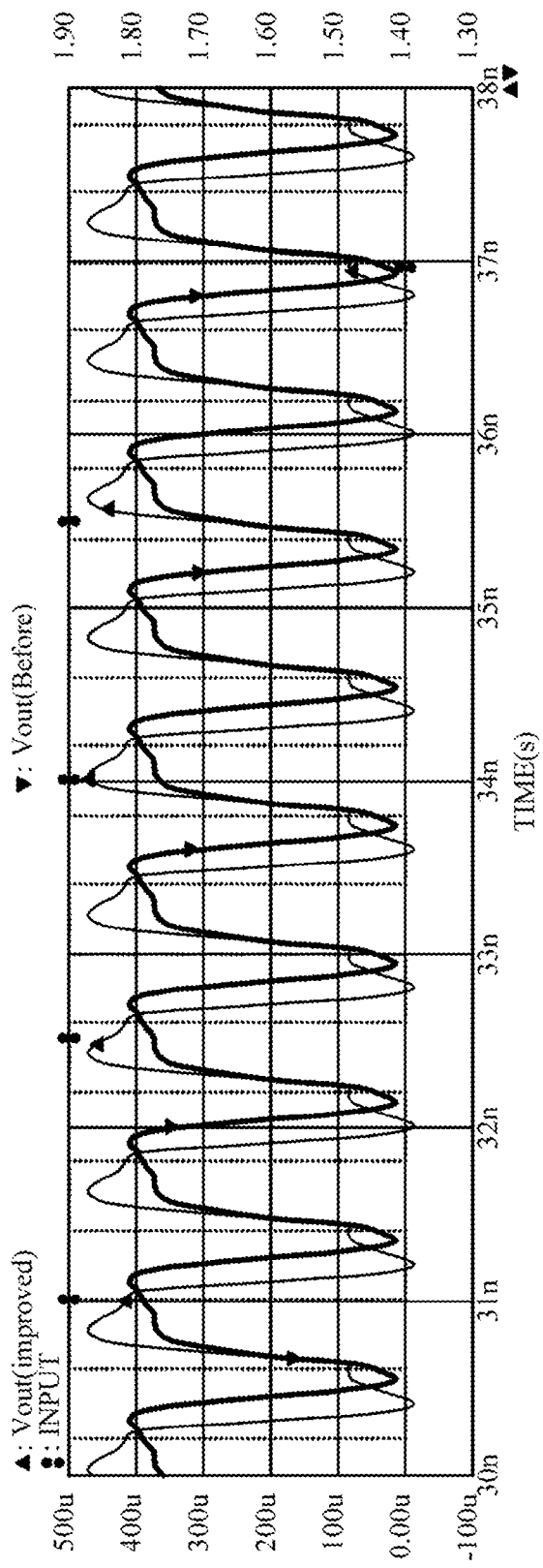
FIG. 9 is a graph illustrating a result of transient simulation of an RGC-type BM-TIA according to an exemplary embodiment of the present disclosure.

FIG. 9 is a graph illustrating a result of transient simulation of an RGC-type BM-TIA according to an exemplary embodiment of the present disclosure.

FIG. 9 is a graph illustrating non-linear properties of output voltage $V_{out1}$ of an RGC-TIA in response to a clock input current between the existing RGC-type BM-TIA and the RGC-type BM-TIA of the present disclosure. In response to an input current $I_{in}$ of 500 uA (blue dotted line), the existing structure (sky-blue solid line) shows non-linear properties, but an RGC-type BM-TIA of the present disclosure (red solid line) have improved the non-linear properties with duty ratio of 0.5. As described above with reference to FIG. 6, the existing structure has a linear input range, for example, of about less than 400 uA, but the RGC-type BM-TIA of the present disclosure has an extended linear input range of about 740 uA, which shows improvement over the linear input range of the existing structure.

Figure 10:
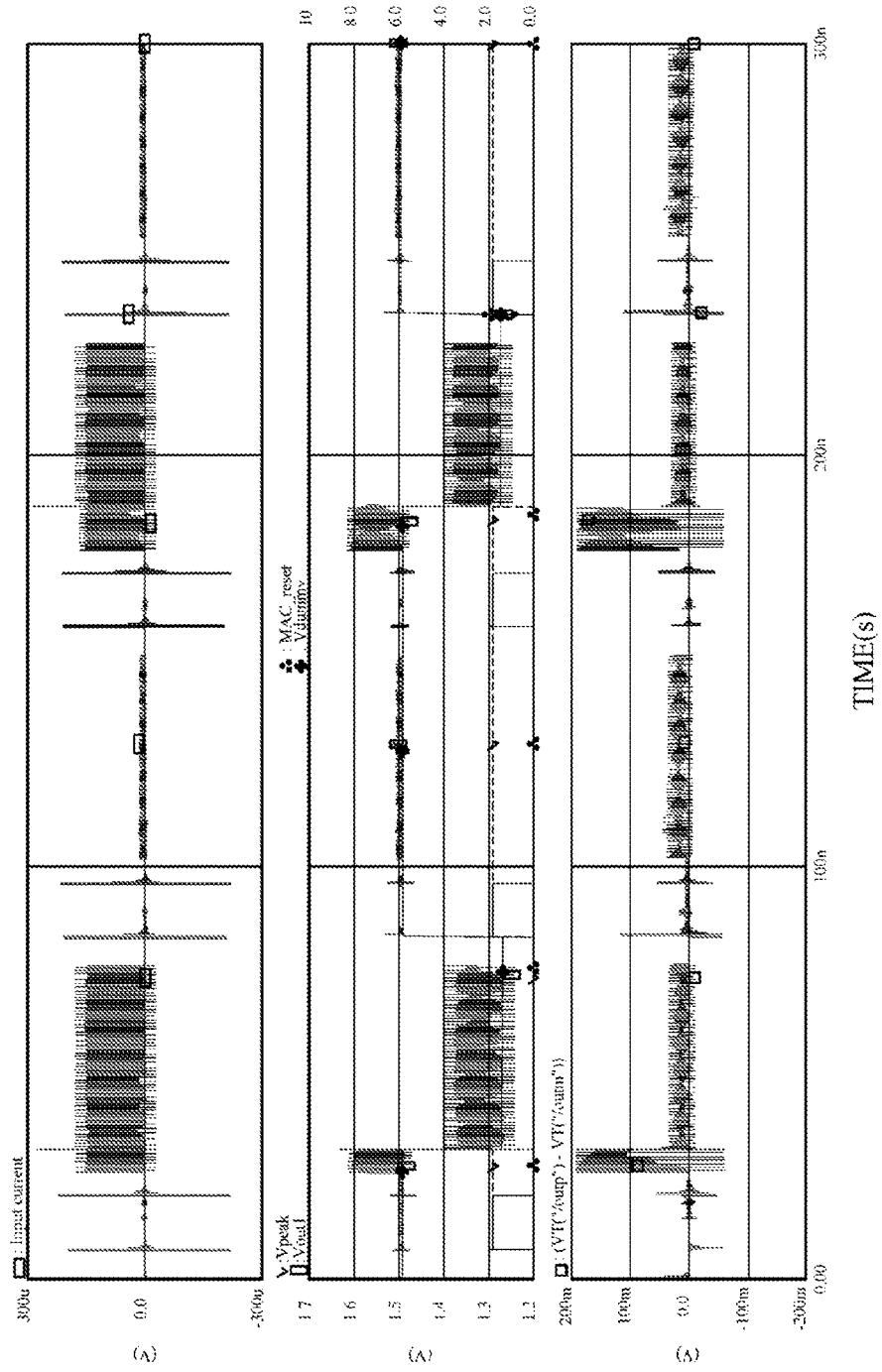
FIG. 10 is a graph illustrating a result of transient simulation of an RGC-type BM-TIA in response to entire burst packet data according to an exemplary embodiment of the present disclosure.

FIG. 10 is a graph illustrating a result of transient simulation in response to entire burst packet data of an RGC-type BM-TIA according to an exemplary embodiment of the present disclosure.

Referring to FIGS. 3 and 10, suppose that an input current is generated and input for 50 nsec with a packet signal of 150 uA and a packet signal of 10 uA, alternatively, along with a null signal (guard time) of 25 nsec. A value of a reset signal MAC reset exists in a null section of a signal for 12.5 nsec and resets the system before a packet signal is received. If a loud burst packet signal of 150 uA is input, the peak detector 36 recognizes the loud burst packet signal of 150 uA within 12 nsec and the digital controller 38 switches a parallel current sources of an RGC TIA using a value of the second control voltage $V_{peak1}$. At this point, input current is distributed to parallel current sources, and thus, the signal of $V_{out1}$ has the same size but a DC value thereof is reduced in a moment. However, a value of $V_{dummy}$ is reduced by the same drop in the DC value, thereby not affecting an output value $V_{out1}$.

Then, if a soft burst packet signal of 10 uA is input, the peak detector 36 amplifies only a signal while keeping a value of $V_{peak}$ intact. Regarding the final output voltage ($V_{out}=V_{outp}-V_{outm}$), a gain of two steps is automatically controlled so that both of an input of 150 uA and an input of 10 uA are changed into an output voltage of the same signal size.

Figure 11:
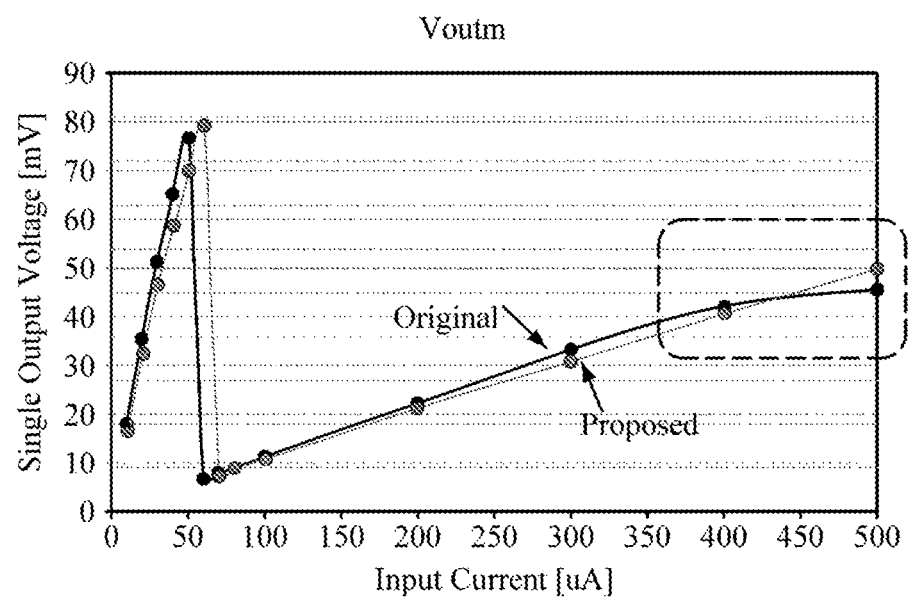
FIG. 11 is a result of simulation about how gain properties of an RGC-TIA of which gain is controlled in two steps is changed according to an exemplary embodiment of the present disclosure.

FIG. 11 is a result of simulation regarding a change in gain properties of an RGC-TIA in which a gain is changed in two steps, according to an exemplary embodiment of the present disclosure.

Referring to FIG. 11, in the case of an input of less than 60 uA, which is a small signal of input current, a great gain is given to a single output voltage and thus a great value of a tilt angle is given. Alternatively, if the case of an input of greater than 60 uA, which is a large signal of input current, a small gain is given and the slope is gentle. In the existing structure, if an input signal has size greater than 400 uA, non-linear properties, which means signal size saturation and a distorted duty ratio. However, using the RGC structure of the present disclosure, it is possible to obtain an output voltage which is linear compared with input current. Thus, it can be found that an RM-TIA having a wider dynamic range may be designed using a RGC TIA proposed in the present disclosure. Therefore, compared with a common source-type BM-TIA which is widely used, the RGC-type BM-TIA according to the present disclosure may have a wide dynamic range with excellent bandwidth and noise properties.

According to an exemplary embodiment, by providing a RGC-type BM-TIA with an improved linear input range, the present disclosure may not only guarantee excellent bandwidth and low-noise properties, which are the benefits of using the RGC structure, but provide a wide linear input range (dynamic range).

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A burst-mode optical pre-amplifier comprising:
   a Regulated Cascode (RGC) type Trans-Impedance Amplifier (TIA),
   wherein a current path is added in the circuit of the RGC-type TIA to control a linearity state of the RGC-type TIA, and a main voltage gain controlled in other circuit blocks after the RGC-type TIA; and wherein
   the current path comprises a switch connected to an input node of the RGC-type TIA in parallel, and a current source connected to the input node of the RGC-type TIA in parallel and to the switch in serial; and
   the current path extends a linear input range of the RGC-type TIA.

2. The burst mode optical pre-amplifier of claim 1, wherein the current path further extends the linear input range of the RGC-type TIA by adjusting a current value of the current source.

3. The burst mode optical pre-amplifier of claim 1, wherein the current path further extends the linear input range of the RGC-type TIA by providing a plurality of current sources arranged in parallel so as to adjust a gain in multiple steps.

4. The burst mode optical pre-amplifier of claim 1, further comprising:
a TIA configured to convert a received current signal into a voltage signal and amplify the voltage signal;
a Single to Differential (S2D) amplifier configured to converts the voltage signal from the TIA into a first differential signal and amplify the first differential signal;
an Auto Offset Cancellation (AOC) amplifier provided appropriate amplification of a second differential signal without waveform distortion by removing a DC-offset in the second differential signal;
a buffer amplifier configured to output a final differential output signal by receiving and amplifying the second differential signal;
a peak detector configured to provide a discrimination value by detecting a level of a peak value of the voltage signal received from the TIA; and
a digital controller configured to provide a first control voltage signal to the S2D amplifier and the buffer amplifier and a second control voltage signal to the TIA by receiving the discrimination value from the peak detector,
wherein the first control voltage signal is for controlling a voltage gain of the S2D amplifier and the buffer amplifier, and the second control voltage signal is for distributing an input current of a RGC core circuit so as to extend the linear input range of the RGC-type TIA.

5. The burst mode optical pre-amplifier of claim 4, wherein, once a loud burst packet signal is applied, the TIA turns on the switch by causing the digital controller to output the second control voltage and distributes a loud input current to the current source connected to the switch so as to be extended the linear input range of the RGC-type TIA.

6. The burst mode optical pre-amplifier of claim 4, wherein the RGC-type TIA comprises:
a first current source supply transistor configured in a manner in which a source is connected to a first ground voltage, a drain is connected to the input node, and a bias voltage is applied to a gate;
a first NMOS transistor configured in a manner in which a source is connected to the input node, a drain is connected to a first resistor, and a gate is connected to an output node of a RGC feedback amplifier,
wherein the RGC feedback amplifier comprises: a second NMOS transistor configured in a manner in which a drain is connected to a second resistor as an output node of the RGC feedback amplifier, a source is connected to a second ground voltage, and a gate is connected to an input node of the RGC amplifier; and the second resistor formed between the output node of the RGC feedback amplifier and a second power voltage; and
the first resistor connected between the drain of the first NMOS transistor and a first power voltage,
wherein an output voltage is output through an output node between the first resistor and the first NMOS transistor.

7. The burst mode optical pre-amplifier of claim 4, wherein the S2D amplifier comprises:
a gain controller configured to receive the first control voltage signal from the digital controller and adjusts a gain of the S2D amplifier in accordance with a source degeneration resistance value; and
a phase calibrator configured to calibrate a phase difference symmetrically between output differential signals.

8. The burst mode optical pre-amplifier of claim 7, wherein the gain controller comprises:
a first transistor configured in a manner in which a source is connected to a ground voltage, a drain is connected to a third transistor, and a bias voltage is input to a gate;
a second transistor configured in a manner in which a source is connected to the ground voltage, a drain is connected to a fourth transistor, and the bias voltage is input to a gate;
the third transistor configured in a manner in which a source is connected to the first transistor, a drain is connected to a first resistor, and an output voltage of the TIA is input to a gate;
the fourth transistor configured in a manner in which a source is connected to the second transistor, a drain is connected to a second resistor, and an output voltage of a dummy TIA to a gate;
a source degeneration resistor formed between the sources of the third transistor and the fourth transistor, and having a resistance value to be determined by the first control voltage;
the first resistor formed between a power voltage and the third transistor;
the second resistor formed between the power voltage and the fourth transistor;
a first output node formed between the third transistor and the first resistor and configured to output a first negative signal; and
a second output node formed between the fourth transistor and the second resistor and configured to output a first positive signal.

9. The burst mode optical pre-amplifier of claim 7, wherein:
the gain controller comprises a fifth transistor formed between a first output node and a second output node and a first capacitor formed between a switch connected to the first output node and a power voltage;
the switch connected to the first output node is controlled by the first control voltage signal which is the same as a voltage that controls the source degeneration resistor and the gate of the fifth transistor, and the first capacitor compensate for a phase difference between a first negative signal and the first positive signal of the gain controller by delaying a phase of a value of the first negative signal as much as a phase of a voltage applied to the fourth transistor is delayed; and
the phase calibrator comprises:
a sixth transistor configured in a manner in which a source is connected to a ground voltage, a drain is connected to a source of an eighth transistor, and a bias voltage is input to a gate;
a seventh transistor configured in a manner in which a source is connected to the ground voltage, a drain is connected to a source of a ninth transistor, and the bias voltage is input to a gate;
the eighth transistor configured in a manner in which the source is connected to the drain of the sixth transistor, a drain is connected to a third resistor, and a gate is connected to the first output node;
the ninth transistor configured in a manner in which the source is connected to the drain of the seventh transistor and the drain of the sixth transistor, a drain is connected a fourth resistor, and a gate is connected to the second output node;

a tenth transistor configured in a manner in which a source is connected to the ground voltage, a drain is connected to a source of a twelfth transistor, the bias voltage is input to a gate;

an eleventh transistor configured in a manner in which the source is connected to the ground voltage, and the bias voltage is input to a gate;

the third resistor formed between the power voltage and the drain of the eighth transistor;

the fourth resistor formed between the power voltage and the drain of the ninth transistor;

a third output node formed in the drain of the eighth transistor and configured to output a second positive signal;

a fourth output node formed in the drain of the ninth transistor and configured to output a second negative signal;

the twelfth transistor configured in a manner in which the source is connected to the tenth transistor, the drain is connected to a gate of a thirteenth transistor and the third output node, and a gate is connected to a drain of the thirteenth transistor;

the thirteenth transistor configured in a manner in which the source is connected the drain of the eleventh transistor, the drain is connected to the gate of the twelfth transistor and the fourth output node, and the gate is connected to the drain of the twelfth transistor;

a second capacitor formed between the ground voltage and the drain of the tenth transistor; and a third capacitor formed between the ground voltage and the drain of the eleventh transistor.

10. The burst mode optical pre-amplifier of claim 4, wherein, in order to prevent the TIA from malfunctioning which occurs when entire DC values become unstable due to the first control voltage signal in a state having a null value, which mean there is no signal, for a reset period, the digital controller transmits the second control voltage signal to the TIA to control switching of the TIA so that the peak detector detects a loud burst packet signal after the reset period to enable the TIA to operate only in a low gain mode.

11. The burst mode optical pre-amplifier of claim 4, wherein the digital controller comprises:

a first latch configured to output a predetermined output value ($\overline{Q}$) by receiving the discrimination value output from the peak detector at node R and an MAC reset signal at node S;

a first inverter configured to outputs the first control voltage signal by inverting the output value ($\overline{Q}$) of the first latch;

a second latch connected to the ground voltage at node R and output a predetermined output value by receiving the MAC reset signal at node S;

an NAND block configured to output an output value of an NAND circuit by receiving the output value (Q) of the first latch and the output value of the second latch; and a second inverter configured to output the second control voltage signal by inverting the output value of the NAND block.

12. The burst mode optical pre-amplifier of claim 4, further comprising:

a dummy TIA having a same structure of the TIA without a input signal and configured to transmit a dummy voltage to the peak detector and the S2D amplifier, wherein the dummy TIA extends the linear input range of the RGC-type TIA as well by receiving the second control voltage signal from the digital controller for distributing an input current of the dummy TIA.

13. A burst-mode optical pre-amplifier comprising:

a Regulated Cascade (RGC) type Trans-Impedance Amplifier (TIA), wherein, according to a magnitude of an input signal, a current path is added in the circuit of the RGC-type TIA to control a linearity state of the RGC-type TIA and a main voltage gain is controlled in other circuit blocks after the RGC-type TIA, wherein the current path comprises a switch connected to an input node of the RGC-type TIA in parallel, and a current source connected to the switch in serial, wherein the switch is controlled by a feedback signal to extend a linear input range of the RGC-type TIA and the current source has a constant current value.

14. The burst mode optical pre-amplifier of claim 13, wherein the current path further extends the linear input range of the RGC-type TIA by comprising the switch and the current source so as to support a two-step gain range.

15. The burst mode optical pre amplifier of claim 13, wherein the current path further extends the linear input range of the RGC-type TIA by comprising a plurality of switches and a plurality of current sources arranged in parallel so as to support a multiple step gain range.

* * * * *